(12) United States Patent
Fujii

(10) Patent No.: US 8,390,230 B2
(45) Date of Patent: Mar. 5, 2013

(54) METHOD OF DETECTING STOP OF TRANSPORT APPARATUS

(75) Inventor: Yoshinori Fujii, Shizuoka (JP)

(73) Assignee: Ulvac, Inc., Kanagawa (JP)

( * ) Notice: Subject to any disclaimer, the term of this patent is extended or adjusted under 35 U.S.C. 154(b) by 444 days.

(21) Appl. No.: 12/671,954

(22) PCT Filed: Sep. 19, 2008

(86) PCT No.: PCT/JP2008/066962
§ 371 (c)(1),
(2), (4) Date: Mar. 17, 2010

(87) PCT Pub. No.: WO2009/038164
PCT Pub. Date: Mar. 26, 2009

(65) Prior Publication Data
US 2011/0229299 A1    Sep. 22, 2011

(30) Foreign Application Priority Data

Sep. 20, 2007 (JP) ................................ 2007-243454

(51) Int. Cl.
*H02P 1/00* (2006.01)
(52) U.S. Cl. ........................................ 318/459; 318/500
(58) Field of Classification Search .................. 318/459, 318/500, 560, 400.34
See application file for complete search history.

(56) References Cited

U.S. PATENT DOCUMENTS

| | | | | |
|---|---|---|---|---|
| 5,296,790 A | * | 3/1994 | Fincher | 318/560 |
| 5,378,975 A | * | 1/1995 | Schweid et al. | 318/685 |
| 5,781,363 A | * | 7/1998 | Rowan et al. | 360/78.09 |
| 6,634,845 B1 | * | 10/2003 | Komino | 414/217 |

FOREIGN PATENT DOCUMENTS

| | | |
|---|---|---|
| JP | 08-189859 A | 7/1996 |
| JP | 2002-076095 A | 3/2002 |
| JP | 2002-292337 A | 10/2002 |
| JP | 2005-12033 A | 1/2005 |
| JP | 2006-016142 A | 1/2006 |
| JP | 2007-136975 A | 6/2007 |

OTHER PUBLICATIONS

International Search Report for PCT Patent App. No. PCT/JP2008/066962 (Oct. 28, 2008).

* cited by examiner

*Primary Examiner* — Rina Duda
(74) *Attorney, Agent, or Firm* — Cermak Nakajima LLP; Tomoko Nakajima

(57) ABSTRACT

There is provided a method of detecting a stop of a transport apparatus which can quickly and easily detect and improve the throughput and the ratio of utilization without incurring an increase the number of parts. The apparatus is used which is provided with a drive motor and a transport arm one side of which is mounted on a rotary shaft of the drive motor. As the drive motor there is used one in which an induced electromotive force is generated when a force in the direction of rotation is applied to the rotary shaft. Then, an article S to be transported is held on the other side of the transport arm. When the drive motor is operated to drive the rotary shaft by a predetermined angle of rotation and then stopped, the above-described induced electromotive force to be generated due to the vibrations of the transport arm is detected.

4 Claims, 3 Drawing Sheets

(a)

(b)

METHOD OF DETECTING STOP OF TRANSPORT APPARATUS

This application is a national phase entry under 35 U.S.C. §371 of PCT Patent Application No. PCT/JP2008/066962, filed on Sep. 19, 2008, which claims priority under 35 U.S.C. §119 to Japanese Patent Application No. 2007-243454, filed Sep. 20, 2007, both of which are incorporated by reference.

TECHNICAL FIELD

The present invention relates to a method of detecting a stop of a transport apparatus and relates, in particular, to a method of detecting the stop of a transport apparatus which is used in transporting a substrate to be processed in the atmosphere or in a vacuum.

BACKGROUND ART

In a step of manufacturing semiconductor devices and flat panel displays, there is used a transport apparatus which transports substrates to be processed such as silicon (Si) wafers, glass substrates, and the like (articles to be transported) to various kinds of processing apparatuses such as for film deposition by sputtering, ion implantation, etching, and the like. As this kind of transport apparatus, there is known an apparatus which is made up of a drive motor, and a transport arm that is attached to a front end of a rotary shaft of this drive motor (patent document 1).

This kind of transport apparatus is built, e.g., in a load lock chamber which is coupled to the above-described processing apparatus, and in a transfer chamber which is disposed among chambers of a plurality of processing apparatuses. A description is made of an example in which substrates are transported into, and out of, a load lock chamber. After having moved one end of the transport arm to the outside of the load lock chamber, the substrate is received from, or handed over to, the transport arm by using a transport robot of a known construction. At this time, the coordinates of the position in which the substrate is received, or handed over, are stored in a controller of the transport robot as teaching data.
Patent Document 1: JP-A-2005-12033

DISCLOSURE OF THE INVENTION

Problems to be Solved by the Invention

In case the substrate is transported as described above, it is required to carry out the receiving and handing over of the substrate to and from the transport arm by the transport robot at a high speed and high precision in order to improve the throughput and ratio of utilization (or operation). However, in case the drive motor is operated to move the transport arm to a predetermined position, the transport arm becomes unstable in behavior due to the inertia force at the time of stopping. In this case, the drive motor having a rotational position detection means such as an encoder, and the like or a stepping motor which is operated in synchronization with pulsed power has a problem in that, while it can recognize that the transport arm has moved to a predetermined position, it cannot detect unstable behavior, i.e., damped vibrations (swinging) in the direction of rotation of the transport arm.

In case the vibrations of the transport arm are large, if the substrate is received by, or handed over to, the transport robot based on the stored coordinates, there will frequently occur poor transport such as positional deviation of the substrate, and the like, resulting in a lowered ratio of utilization. This kind of problem will be kept under control if the substrate begins to be received from, or handed over to, the transport robot once the behavior (vibrations) of the transport arm after its movement has been sufficiently damped and stabilized (i.e., if a longer time can be secured to the time of receiving or handing over). This solution cannot, however, improve the throughput.

On the other hand, it is possible to measure the vibrations of the transport arm with a displacement sensor, and the like to detect that the vibrations have been damped to a predetermined range, and it is then possible to start the receiving and the handing over. This will, however, not only complicate the control but also brings about an increase in the number of parts and higher costs. In addition, accurate detection in the vacuum is difficult.

It is therefore a problem of this invention, in view of the above points, to provide a method of detecting the stop of a transport means, in which the stop of the transport means after operation can be quickly and easily detected and in which the throughput and the ratio of utilization can be improved without incurring an increase in the number of parts.

Means for Solving the Problems

In order to solve the above problems, this invention is method of detecting a stop of a transport apparatus. The apparatus comprises: a drive motor; and a transport arm one end of which is mounted on a rotary shaft of the drive motor, the drive motor being of such a construction that an induced electromotive force is generated when a force in a direction of rotation is applied to the rotary shaft. The method comprises: detecting the induced electromotive force that is generated due to vibrations of the transport arm when the drive motor is driven to rotate the rotary shaft by a predetermined angle of rotation and is then stopped in a state in which an article to be transported is held at an opposite end of the transport arm; and judging the transport arm to have stopped when the detected induced electromotive has fallen below a predetermined value.

According to this invention, when the drive motor is driven to rotate the rotary shaft by a predetermined angle of rotation, thereby moving the transport arm to a predetermined position, the behavior of the transport arm becomes unstable due to an inertia force at the time of stopping, i.e., damped vibrations occur to the transport arm. At this time, there will be operated on the rotary shaft a force which is repeated in the direction of rotation. As a result, an induced electromotive force is generated, for example, among the coils of the motor. By measuring this induced electromotive force, if the measured induced electromotive force becomes smaller than a predetermined value that is set in advance, it can be detected that the vibrations of the transport arm after moving have been damped and stabilized into a range in which transport failure such as a positional deviation and the like of the substrate does not occur.

According to this invention, without using a separate part such as a displacement sensor, and the like, the stabilization of the vibrations of the transport arm after the operation can be quickly and surely detected even in a vacuum by means of the electric changes of the drive motor itself that is necessarily used to drive the transport arm. Accordingly, in case the article to be transported is received by, or handed over to, the transport robot, the throughput and the ratio of utilization can be improved, and that can be done at a low cost.

Further, in this invention, the vibrations after the operation of the transport arm are monitored by means of the induced electromotive force that is generated in the drive motor as described above. Therefore, in case the amplitude of the damped vibrations or the time to the vibration damping exceeds a predetermined value, a diagnosis can be made that the transport apparatus itself has given rise to abnormalities due to degradation of the drive motor itself or of the bearings, and the similar causes. Accordingly, the method of detecting a stop of the transport apparatus of this invention also functions as a method of detecting the abnormalities of the transport apparatus itself.

In this invention, preferably, the drive motor is a stepping motor.

It is to be noted here that the frequency of this kind of damped vibrations makes little or no change provided the conditions are equivalent such as the rotating torque of the drive motor to be used, length of the transport arm, weight of the article to be transported, and the like. Therefore, in case the above-described induced electromotive force is detected, preferably only a signal of particular frequency is selectively extracted. Then, only the induced electromotive force attributable to the above-described damped vibrations can surely be measured without being influenced by the noises that are contained in the output from a driver of the drive motor.

BEST MODE OF CARRYING OUT THE INVENTION

Figure 1:
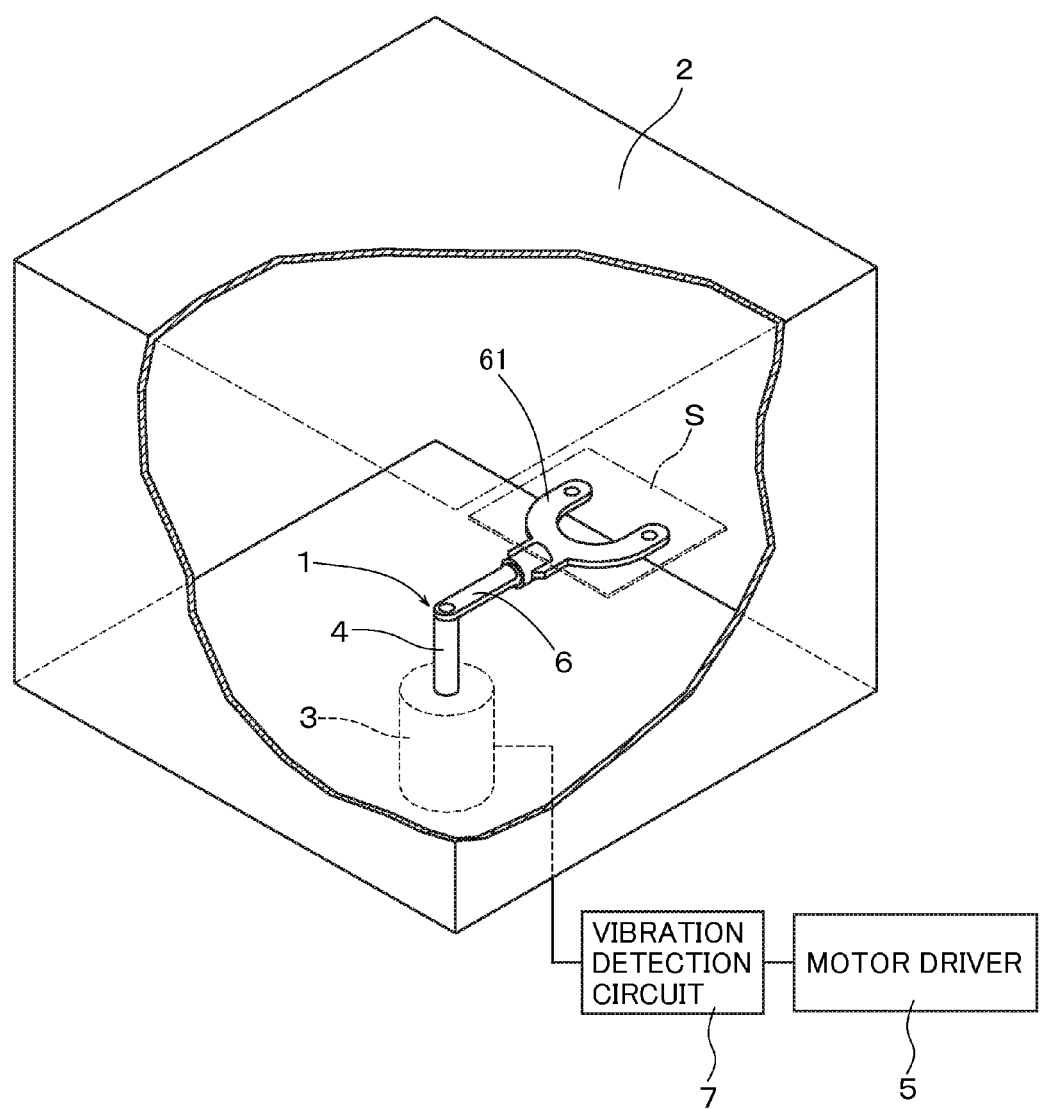
FIG. 1 is a perspective view to explain an arrangement of a transport apparatus in a load lock chamber.

A description will now be made with reference to FIG. 1, in which reference numeral 1 is a transport apparatus according to an embodiment of this invention. The transport apparatus is disposed, e.g., in a load lock chamber 2 that is capable of forming therein a vacuum. The load lock chamber 2 is connected to various processing apparatuses (not illustrated) for, e.g., film deposition by sputtering, ion implantation, etching, and the like, and is used for transporting a substrate to be processed (an article to be transported) such as a glass substrate, a silicon (Si) wafer, and the like from the atmosphere to the above-described apparatuses in a vacuum state.

The transport apparatus 1 is provided with a stepping motor (drive motor) 3 which is disposed on an outside of the load lock chamber 2. The stepping motor 3 is of a known construction such as a two-phase unipolar permanent magnet (PM) type, and the like which is made up of a stator provided with winding coils and a rotor. The rotor (not illustrated) has connected thereto a rotary shaft 4 which is vertically disposed, via vacuum sealing, through a wall surface of the load lock chamber 2. In this configuration, by causing the electric current to sequentially flow by pulse signals from a motor driver 5 between DC terminals and the respective terminals of the coils, the rotor and, consequently, the rotary shaft 4 are rotatably driven by the unit of predetermined steps.

One end of the rotary shaft 4 is provided with a transport arm 6 positioned inside the load lock chamber 2. The transport arm 6 to be used in transporting the substrates such as glass substrates and silicon wafers is formed at a front end thereof as a finger portion 61. It is thus so arranged that the substrate S can be supported in a state of being small in area of contact of the transport arm 6 with the substrate S.

Figure 2:
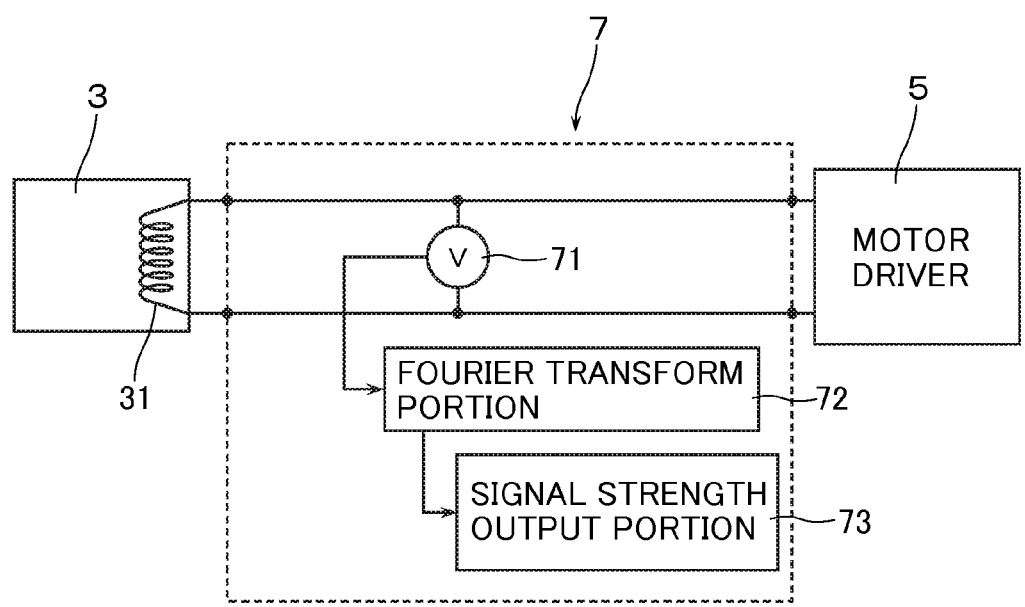
FIG. 2 is a diagram to explain an arrangement of vibration detection circuit which is used in carrying out this invention.

In addition, between the stepping motor 3 and the motor driver 5, there is provided a vibration measuring circuit 7 for detecting the vibrations of the transport arm 6, the vibrations being attributable to the stopping of rotation of the stepping motor 2. The vibration measuring circuit 7 is provided with a voltage measuring portion 71 for measuring the potential that is generated among the coils 31 (see FIG. 2).

It is to be noted here that the DC output to each terminal of the coils from the motor driver 5 to the stepping motor 3 may possibly contain various high-frequency noises on the circuit. On the other hand, the frequency of the above-described vibrations will be made little or no change, and the vibrations will be damped, if the conditions are equivalent such as the rotation torque of the stepping motor 3 that is used, the length of the transport arm 2, the weight of the substrate S, and the like (see FIG. 3(a)). Therefore, there is provided a transformation portion 72 which performs Fourier transform of the measured potential to a signal strength at a predetermined frequency (e.g., 6 Hz). It is thus so arranged that only the induced electromotive force attributable to the vibrations of the transport arm 6 can be selectively read off. Then, the signal strength obtained in the transformation portion 72 is outputted to the motor driver 5 via the output portion 73 (see FIG. 2).

Figure 3:
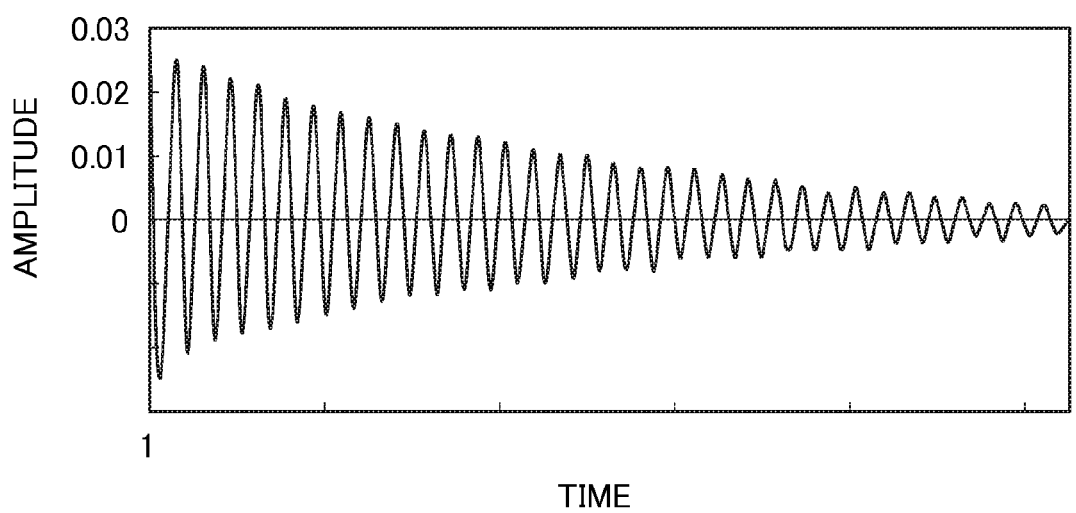
FIG. 3(a) is a diagram to explain the damped vibrations of the transport arm.
FIG. 3(b) is a diagram to explain the change in the signal strength accompanied by damped vibrations in a predetermined frequency.
Figure 3:
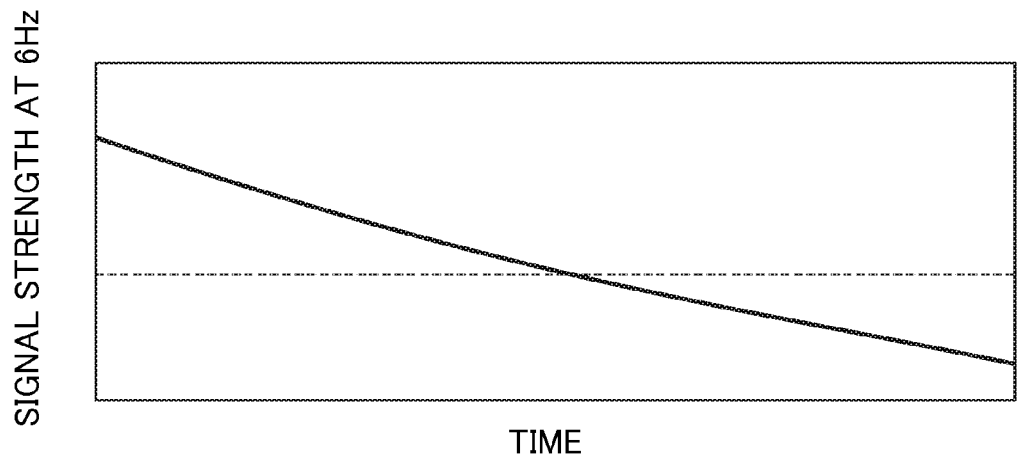

In this case, the motor driver 5 has stored in advance correlation data between the below-described potential and the amount of swinging (amplitude of vibration), the correlation data being obtained by: measuring with an oscilloscope and the like the electric potential to be generated among the coils of the stepping motor 3 when the transport arm 6 is vibrated at a predetermined frequency (e.g., 6 Hz); and subjecting the measured wave form to Fourier transform to thereby obtain a signal strength at the above-described predetermined frequency (see FIG. 3(b)). A description will hereinafter be made of a method of detecting the stop of the transport apparatus 1 according to this invention.

In the atmospheric condition of the load lock chamber 2, a gate valve (not illustrated) disposed on the load lock chamber 2 is left open, and the stepping motor 3 is driven to rotate by the control from the motor driver 5. The finger portion 61 is thus moved to a predetermined position on the outside of the load lock chamber 2. When the stepping motor 3 has stopped rotating and the transport arm 6 has come to a stop, the transport arm 6 will be subject to damped vibrations in the direction of rotation due to the inertia force at the time of stopping. At this time, a repeated force in the direction of rotation will be applied to the rotary shaft 4. An induced electromotive force will thus be generated by the change with time of the magnetic flux that passes through the coils, and the electric potential thereof is measured by the voltage measuring portion 71 of the vibration measuring circuit 7.

Subsequently, the electric potential measured in the transformation portion 72 is transformed by Fourier transform to a signal strength at a preset particular frequency (e.g., 6 Hz), and the signal strength is outputted to the motor driver 5 through the output portion 73. Then, when the signal strength becomes smaller than the preset value, the motor driver 5 detects that the vibrations after movement of the transport arm 6 have been damped and stabilized to a range in which transport failure such as positional deviation of the substrate S and the like does not occur, and the detected result is outputted to the controller of the transport robot. Thereafter, the substrate S is received from, or handed over to, the finger portion 61 by the transport robot.

In case the substrate S has been changed to one having different weight, the frequency of vibrations will change. Therefore, it is preferable to make it possible to adequately set in the motor driver 5 the signal strength and a threshold value of the signal strength that determines the vibration stability.

As described hereinabove, according to this embodiment, the stability of vibrations of the transport arm 6 after movement both in the vacuum and in the atmosphere can be quickly and surely detected, without using separate parts such as displacement sensors and the like, the detection being made by the electric changes of the driving motor 3 that is necessarily used in constituting the transport apparatus 1. Therefore, when the substrate S is received by, or handed over to, the transport robot, the throughput and the ratio of utilization can be improved at a lower cost.

Further, according to this embodiment, since the vibrations of the transport arm 6 after movement are being monitored, in case the amplitude of damped vibrations and the time to the vibration damping exceeds predetermined values, diagnosis can be made that abnormality (mechanical trouble) has occurred to the stepping motor 3 and the like due to deterioration and the like of the stepping motor 3 itself and the bearings. Accordingly, the method of detecting the stop of the transport apparatus 1 as described hereinabove can be utilized also as the method of detecting the abnormality of the transport apparatus 1 itself.

In this embodiment, a description has so far been made of an arrangement in which Fourier transform portion is disposed in order to surely measure only the induced electromotive force attributable to the damped vibrations, without being influenced by the noises that are included in the output from the motor driver 5. However, without being limited thereto, an arrangement may also be made such that only the induced electromotive force of a particular frequency can be efficiently measured by using a known means such as a high pass filter, low pass filter and the like.

In addition, in this embodiment, a description has been made of an arrangement in which, as the vibration measuring circuit, the induced electromotive force to be generated among the coils can be directly measured by the voltage measuring portion 71. Without being limited thereto, a circuit may also be arranged to measure the potential, e.g., by disposing a resistor in series with the output from the motor driver.

DESCRIPTION OF REFERENCE NUMERALS AND CHARACTERS

1 transport apparatus
3 stepping motor (drive motor)
4 rotary shaft
6 transport arm
7 vibration detection circuit
S substrate (article to be transported)

What is claimed is:

1. A method of detecting a stop of a transport apparatus, comprising:
    providing a drive motor, and a transport arm, one end of which is mounted on a rotary shaft of the drive motor, the drive motor being of such a construction that an induced electromotive force is generated when a force in a direction of rotation is applied to the rotary shaft
    rotating the rotary shaft by a predetermined angle of rotation in a state in which an article to be transported is held at an opposite end of the transport arm;
    stopping the rotary shaft;
    detecting the induced electromotive force that is generated due to vibrations of the transport arm caused by the rotating and the stopping of the shaft; and
    judging the transport arm to have stopped when the detected induced electromotive has fallen below a predetermined value.

2. The method of detecting a stop of a transport apparatus according to claim 1, wherein the drive motor is a stepping motor.

3. The method of detecting a stop of a transport apparatus according to claim 1, wherein only a signal of particular frequency is selectively extracted when the induced electromotive force is detected.

4. The method of detecting a stop of a transport apparatus according to claim 2, wherein only a signal of particular frequency is selectively extracted when the induced electromotive force is detected.

* * * * *